United States Patent
Han et al.

(10) Patent No.: US 11,094,762 B2
(45) Date of Patent: Aug. 17, 2021

(54) DISPLAY DEVICE AND METHOD FOR MANUFACTURING THE SAME

(71) Applicant: LG Display Co., Ltd., Seoul (KR)

(72) Inventors: Kyu-Il Han, Paju-si (KR); Nam-Seok Yoo, Seoul (KR); Jin-Ho Park, Goyang-si (KR); Mi-Na Kim, Paju-si (KR); Hyung-Won Park, Incheon (KR); Jung-Mo Cho, Seoul (KR); Yu-Ri Park, Seoul (KR); Hyoung-Min Kim, Busan (KR); Seung-Ho Son, Pohang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/725,785

(22) Filed: Dec. 23, 2019

(65) Prior Publication Data
US 2020/0212147 A1    Jul. 2, 2020

(30) Foreign Application Priority Data
Dec. 28, 2018  (KR) .......................... 10-2018-0173127

(51) Int. Cl.
| | |
|---|---|
| H01L 27/32 | (2006.01) |
| H01L 51/00 | (2006.01) |
| H01L 51/52 | (2006.01) |
| H01L 25/18 | (2006.01) |
| H01L 25/00 | (2006.01) |
| H04N 5/225 | (2006.01) |
| H01L 51/56 | (2006.01) |

(52) U.S. Cl.
CPC .......... *H01L 27/3246* (2013.01); *H01L 25/18* (2013.01); *H01L 25/50* (2013.01); *H01L 51/0096* (2013.01); *H01L 51/5253* (2013.01); *H01L 51/56* (2013.01); *H04N 5/2254* (2013.01); *H01L 2227/323* (2013.01)

(58) Field of Classification Search
CPC .. H01L 27/326; H01L 27/124; H01L 51/5246
See application file for complete search history.

(56) References Cited

U.S. PATENT DOCUMENTS

| | | | |
|---|---|---|---|
| 2016/0240598 A1* | 8/2016 | You ...................... | H01L 27/3276 |
| 2017/0288004 A1* | 10/2017 | Kim ...................... | H01L 27/3276 |
| 2019/0245958 A1* | 8/2019 | Cheng ................... | G06F 1/1637 |

\* cited by examiner

*Primary Examiner* — Alia Sabur
(74) *Attorney, Agent, or Firm* — Fenwick & West LLP

(57) ABSTRACT

Disclosed is a display device. In accordance with the display device, before an organic stack of a light-emitting diode is formed, a sticker is attached to a substrate, while a camera hole-forming portion and a margin area around the same are present, to form the organic stack, and the sticker and components on top of the sticker, such as the organic stack, are removed, so that the edge of the organic stack can be aligned without any additional process using separate masks and the reliability of the display device can be improved due to the provision of the organic stack at a location spaced apart from the camera hole by the margin area.

14 Claims, 16 Drawing Sheets

DISPLAY DEVICE AND METHOD FOR MANUFACTURING THE SAME

CROSS-REFERENCE TO RELATED APPLICATIONS

This application claims the benefit of Republic of Korea Patent Application No. 10-2018-0173127, filed on Dec. 28, 2018, which is hereby incorporated by reference in its entirety.

BACKGROUND

Field of Technology

The present disclosure relates to a display device, and more particularly to a display device having improved reliability by designing a structure including a camera hole in an active area where the display is realized, rather than in an outer bezel area, and a method for manufacturing the same.

Discussion of the Related Art

The recent advent of the information age has brought about remarkable development in the field of displays that visually represent electric information signals. In response thereto, a variety of flat display devices having excellent performance, such as slimness, light weight and low power consumption, have been developed and have rapidly replaced conventional cathode ray tubes (CRTs).

Specific examples of the flat display devices include liquid crystal displays (LCDs), plasma display panel devices (PDPs), field emission display devices (FEDs), organic light-emitting devices (OLEDs) and the like.

Among them, organic light-emitting displays are considered a competitive application capable of realizing compactness and representing vivid color of the devices without requiring a separate light source.

Meanwhile, organic light-emitting displays are applied to various display devices such as televisions, cellular phones, e-books, monitors, notebooks and the like. In addition, organic light-emitting displays may be used in combination with cameras to perform a function of displaying a screen as well as a function of checking and editing an obtained image.

Since a camera and a display panel are formed in separate processes, the display device is generally implemented in such a manner that the camera is accommodated in a bezel area at the periphery of the display panel.

However, in this case, due to the configuration of modules for driving the camera, the bezel area at the periphery of the display panel may protrude, or a portion which needs to be shielded at the periphery of the display panel may be increased, so the width and thickness of the bezel area are inevitably increased. This configuration makes the device thicker and hinders the visibility of users. Thus, efforts have been made to improve these problems.

SUMMARY

Accordingly, the present disclosure is directed to a display device and a method for manufacturing the same that substantially obviate one or more problems due to the limitations and disadvantages of the related art.

An object of the present disclosure is to provide a display device having improved reliability by designing a structure including a camera hole in an active area where the display is realized, rather than in an outer bezel area, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

According to the display device of the present disclosure, before the organic stack of the light-emitting diode is formed, a sticker is attached to the substrate, while a margin area is maintained around a region in which the camera hole is formed, to form an organic stack, and the sticker and the component, such as the organic stack, on top of the sticker are removed, so that the edge of the organic stack can be aligned without any additional process of separate masks and the reliability of the display device can be improved due to the provision of the organic stack spaced apart from the camera hole with a margin area.

To achieve these objects and other advantages and in accordance with the purpose of the invention, as embodied and broadly described herein, a display device includes a substrate having an active area and an outer area (bezel) surrounding the active area, at least one camera hole provided in the active area of the substrate, and a light-emitting element spaced apart from the camera hole by a predetermined margin area in the active area, the at least one light-emitting element including an organic stack including at least one common layer, and a first electrode and a second electrode respectively disposed below and on the organic stack.

The organic stack may include an organic light-emitting layer, a first common layer disposed below the organic light-emitting layer, and a second common layer disposed on the organic light-emitting layer, wherein the first common layer, the second common layer, and the second electrode are spaced apart from the camera hole by a same distance corresponding to the margin area.

The organic light-emitting layer may be spaced farther apart from the camera hole than the first common layer.

The organic stack and the second electrode may be not provided in the margin area including the camera hole.

The margin area on the substrate further may include a dam pattern on the substrate.

The sidewall of the camera hole may be formed by the substrate and a plurality of inorganic layers on the substrate.

An uneven portion may be provided in at least one of the substrate or the plurality of inorganic layers in the margin area such that the uneven portion is spaced apart from the camera hole.

The display device may further include an encapsulation stack covering the at least one light-emitting element on the substrate excluding the camera hole, and including at least one organic film and at least one inorganic film.

The at least one organic film of the encapsulation stack may be spaced apart from the camera hole in the margin area, and the at least one inorganic film of the encapsulation stack may form a part of a sidewall of the camera hole. The inorganic films on and below the organic film may contact the sidewall of the camera hole in a vertical direction.

The first common layer, the second common layer and the second electrode may cover a portion of the active area excluding a region including the camera hole and the margin area, and may extend outwards to be provided in a portion of the outer area (bezel).

In another aspect of the present disclosure, a method for manufacturing a display device includes preparing a substrate having an active area and an outer area surrounding the active area, defining a plurality of subpixels on the substrate in the active area excluding a camera-hole-forming portion and a margin area surrounding the camera-hole-forming portion by a predetermined distance, and forming a first electrode in each of the plurality of subpixels, forming a bank for opening at least a portion of the first electrode of each of the plurality of subpixels, attaching a sticker to the substrate such that the sticker covers the camera-hole-forming portion and the margin area, forming an organic stack including at least one organic layer and a second electrode on the sticker and each of the plurality of subpixels, removing the sticker and the structure on the sticker from the substrate, forming an encapsulation stack on the substrate, and removing the camera-hole-forming portion to form a camera hole.

In the step of forming the organic stack and the second electrode, the organic stack and the second electrode formed on the substrate may be isolated from each other, based on the edge of the sticker.

The organic stack and the second electrode remaining on the substrate after the forming the organic stack and the second electrode may be spaced apart from the edge of the camera-hole-forming portion by the same distance.

The method may further include inserting a camera lens into the camera hole and mounting a camera bezel for operating and supporting the camera lens below the substrate such that the camera bezel partially overlaps the margin area on a rear surface of the substrate.

The method may further include cleaning the substrate immediately before the forming the organic stack and the second electrode and immediately after removing the sticker.

The step of attaching the sticker may include laminating a predetermined portion of a sticker film having an adhesive surface on the substrate.

The step of attaching the sticker may include setting a pre-cutting region in the sticker film having an adhesive surface and then squeezing the sticker film to attach the adhesive surface to the substrate.

The step of forming the camera hole may include removing a boundary of the camera hole on the rear surface of the substrate through laser trimming.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
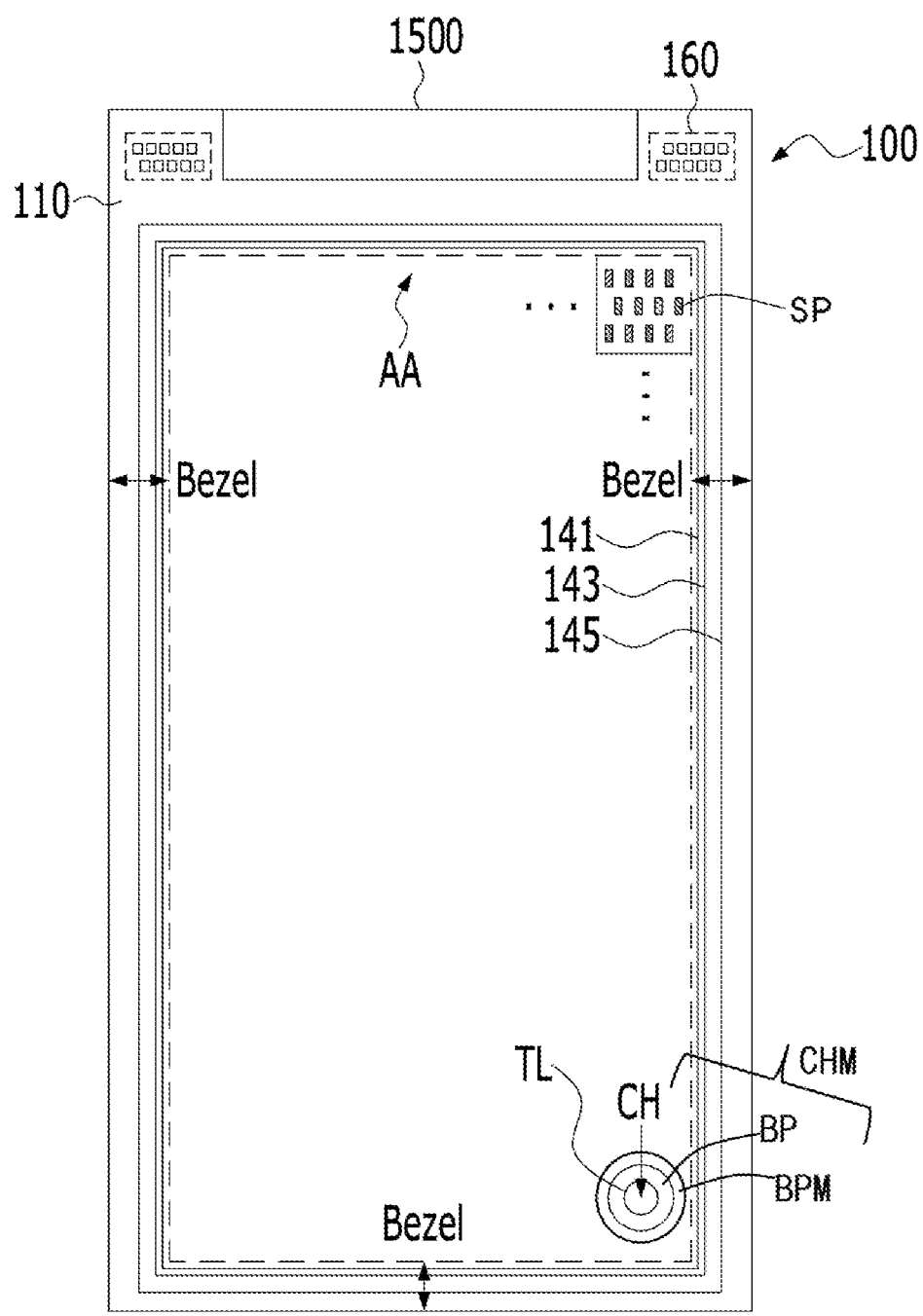
FIG. 1 is a plan view illustrating a display device according to one embodiment of the present disclosure.

Reference will now be made in detail to the preferred embodiments of the present invention, examples of which are illustrated in the accompanying drawings. Wherever possible, the same reference numbers will be used throughout the drawings to refer to the same or like parts.

The advantages and features of the present invention and methods of achieving the same will be more clearly understood from the following detailed description taken in conjunction with the accompanying drawings. However, the present invention is not limited to the embodiments described below, and can be implemented in various forms. The embodiments of the present invention are provided only to completely disclose the present invention and fully inform a person having ordinary knowledge in the field to which the present invention pertains of the scope of the present invention. Accordingly, the present invention is defined only by the scope of the claims.

The shapes, sizes, ratios, angles, numbers and the like shown in the drawings to illustrate the embodiments of the present invention are merely exemplary, and the invention is not limited to the illustrated details. Wherever possible, the same reference numbers will be used throughout the drawings to refer to the same or like parts. In the following description, detailed descriptions of the related prior art may be omitted so as to avoid unnecessarily obscuring the subject matter of the present invention. When terms such as "including", "having" and "comprising" are used throughout the specification, additional components may also be present, unless "only" is used. A component described in a singular form encompasses components in a plural form unless particularly stated otherwise.

It will be interpreted that a constituent component includes an error range, even when there is no additional particular description thereof.

In describing positional relationships in the description of various embodiments of the present invention, when terms such as "on", "above", "under" and "next to" are used to describe the relationship between two elements, at least one intervening element may be disposed between the two elements unless "immediately" or "directly" is used.

In describing temporal relationships in the description of various embodiments of the present invention, it will be understood that when terms such as "after", "subsequently", "next" and "before" are used to describe the temporal relationship between two elements, the non-continuous case may be included, unless "immediately" or "directly" is used.

It will be understood that, although the terms "first", "second", etc. may be used herein to describe various elements, these terms should not be construed as limiting the elements, and are used only to distinguish one element from another. Accordingly, a first element mentioned below may be a second element without exceeding the technical concept of the present invention.

It will be understood that each of the features of the various embodiments of the invention may be partly or entirely united or combined with one another, and it will be sufficiently understood by those skilled in the art that the embodiments can be linked to each other or driven within the technical scope in various ways and can be implemented independently of each other or simultaneously implemented in association with each other.

Figure 2:
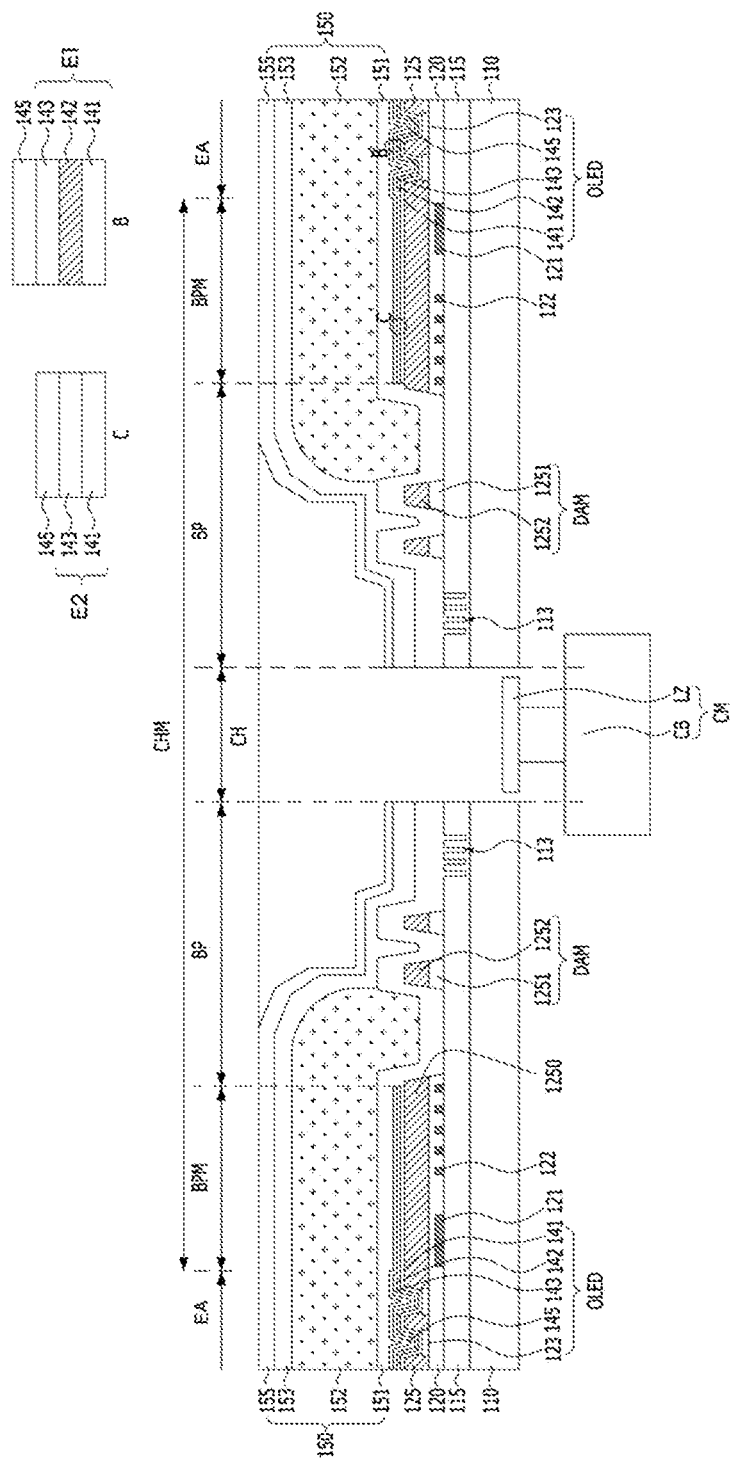
FIG. 2 is a sectional view taken along line I-I' of FIG. 1 according to one embodiment of the present disclosure.

FIG. 1 is a plan view illustrating a display device according to an embodiment of the present disclosure and FIG. 2 is a sectional view taken along line I-I' of FIG. 1.

As shown in FIGS. 1 and 2, the display device 100 according to the present invention includes a substrate 110 that has an active area AA and an outer area (bezel) surrounding the active area, and a plurality of sub-pixels SP that is disposed in the active area of the substrate, excluding a camera hole margin CHM including at least one camera hole CH provided inside the active area of the substrate, and that each includes an organic light emitting diode (OLED) including a first organic stack E1 including at least a light-emitting layer 142, and first electrode 123 and second electrode 145 respectively disposed in lower and upper parts of the first organic stack E1, wherein the first organic stack E1 is spaced apart from the camera hole CH by a distance greater than or equal to a margin area BP.

Between the camera hole CH and the active area (effective light-emitting area, EA) of the sub-pixel most adjacent thereto, a dummy area BPM having a second organic stack E2 including at least one organic layer 141 or 143 may be further provided, in addition to the margin area BP. In some cases, the camera hole CH and the light-emitting area EA having the first organic stack E1 may contact the outer circumference of the margin area BP without the dummy area BPM.

Here, the margin area BP means a region with a predetermined width that is immediately adjacent to the camera hole CH and surrounds the camera hole CH, and is a region, where the organic stack E1 or E2 is not formed, which is provided in order to reduce the phenomenon in which the energy of laser irradiation is transferred to the side and thus stress is propagated when the camera hole CH is formed by laser irradiation.

In addition, the dummy area BPM is a region surrounding the outer circumference of the margin area BP, provided as described above, and does not contribute to actual light emission because it does not include the light-emitting layer 142, but includes the organic layers 141 and 143, which are continuously formed, as common layers in the adjacent organic stack E1. Via wiring lines 121 and 122 passing through the periphery of the camera hole CH are disposed in the dummy area BPM. For example, when the light-emitting layer 142 is formed using a fine metal mask, the dummy area BPM is provided, and when the light-emitting layer 142 is formed by a common mask in the same manner as the common layers 141 and 143, the dummy area BPM may be omitted.

The display device 100 includes various constituent components on the substrate 110. In addition, the substrate 110 is divided into the active area AA (area inside dotted lines) which includes the plurality of sub-pixels SP and in which a display is realized, and the outer area (bezel) surrounding the active area AA.

The substrate 110 may be formed of a transparent insulating material, for example, an insulating material such as glass or plastic. When the substrate 110 is formed of plastic, it may be referred to as a "plastic film" or a "plastic substrate". For example, the substrate 110 may be in the form of a film including one selected from the group comprising of polyimide polymers, polyester polymers, silicone polymers, acrylic polymers, polyolefin polymers, or copolymers thereof. Among these materials, polyimide is widely used as a plastic substrate because it can be applied to high-temperature processes and can be coated. The substrate (array substrate) may conceptually include an element and a functional layer formed on the substrate 110, for example, a switching TFT, a driving TFT connected to the switching TFT, an organic light-emitting element connected to the driving TFT, a protective (passivation) film, and the like.

One of the sides corresponding to the edges of the substrate 110 has a relatively larger area than the other side and has the outer area (bezel), and includes a pad part and a driving driver 1500 connected thereto to apply a signal in this area.

A touch dummy pad 160 may be disposed at both sides of the driving driver 1500, which is connected to a touch pad of a touch panel (not shown) formed to face the substrate 110 to transfer a touch-driving signal thereto. The touch dummy pad 160 may be connected to the driving driver 1500 to receive the touch-driving signal from the driving driver 1500 or a timing controller connected thereto. In some cases, when a touch driving unit on the side of the touch panel is provided separately or when a touch-driving electrode is directly formed on an encapsulation stack, the touch-driving electrode and the driving line on the substrate 110 can be connected to each other. Thus, the touch dummy pad 160 can be omitted.

The planar shape of the active area AA shown in FIG. 1 may be substantially rectangular, but is not limited thereto. The planar shape of the active area AA may be changed in various forms. In most cases, the active area AA may be provided within a predetermined width from the edge of the substrate 110 while having a shape similar to the substrate 110.

A plurality of sub-pixels SP is disposed in the active area AA. For example, the sub-pixels SP of FIG. 1 have red R, green G, and blue B light-emitting units and are repeatedly disposed in the active area AA. In some cases, the sub-pixels SP may further include a white light-emitting unit, or a combination of light-emitting units having colors other than red, green and blue. A component that has a set including individual sub-pixels of different colors to represents white is referred to as a "pixel."

When the light-emitting layer of a light-emitting diode disposed in each sub-pixel SP is an organic light-emitting layer, the light-emitting diode is referred to as an "organic light-emitting diode (OLED)" and a display device including the organic light-emitting diode is referred to as an "organic light-emitting display device." FIG. 2 shows a configuration in which a display device includes an organic light-emitting diode (OLED). However, the present disclosure is not limited thereto. When an inorganic light-emitting layer is provided as a light-emitting layer of the light-emitting diode, an inorganic light-emitting element, for example, a quantum dot light-emitting element can be obtained, and a display device including the quantum dot display element is referred to as a "quantum dot light-emitting display device."

In the structure of the light-emitting diode in which the common layers are formed to cover at least the active area using an open mask during the process of forming the light-emitting diode (e.g., OLED), the display device according to the present disclosure is designed so as to reduce moisture permeation paths from being provided due to the exposure of these layers on the sidewall of the camera hole CH. Therefore, the shape of the periphery of the camera hole of the display device of the present disclosure can be applied to light-emitting display devices other than the illustrated organic light-emitting display device, as long as the display device has a common layer and includes a camera hole in the active area.

Meanwhile, the light-emitting display device according to an embodiment of the present disclosure is characterized in that a camera module CM for obtaining as well as displaying an image is inserted into the active area AA.

The camera module CM has a camera hole CH in the active area AA of the substrate 110 and includes a camera lens LZ introduced into the camera hole CH, and a camera bezel CB supporting the camera lens LZ and having a driver. The camera bezel CB may be formed to have a larger area than the camera hole CH and may be disposed on the rear side of the substrate 110.

The camera bezel CB is positioned below the substrate 110, compared to the camera lens LZ introduced into the camera hole CH, and is attached to the substrate 110 or to a separate support member and is coupled to the substrate 110. For this purpose, the camera module CM overlaps the substrate 110 by a predetermined distance at the periphery of the camera hole CH. The predetermined distance, that is, the width that the camera module CM overlaps the substrate 110, is within the margin area BP around the camera hole CH. The sum of the width of the margin area BP around the camera hole CH and the width of the dummy area BPM adjacent thereto may be set to correspond to the diameter of the camera hole CH. However, the present invention is not limited thereto. As long as moisture does not penetrate the sidewall of the camera hole CH and stress is not transferred in the lateral direction during laser trimming for forming the camera hole CH, the width of the margin area BP and the dummy area BPM at one side may be reduced to less than or equal to the diameter of the camera hole CH. The margin area BP and the dummy area BPM are defined so as to surround the periphery of the camera hole CH. The reason for this is that the margin area BP is positioned at the periphery of the camera hole CH and is used as a region for protecting the sidewall of the camera hole from moisture or outside air.

FIG. 1 shows a configuration in which a separate support member is omitted between the substrate 110 and the camera bezel CB.

A double-sided tape (not shown) may be further provided between the camera bezel CB of the camera module CM and the rear surface of the substrate 110 to fix the camera module CM and the substrate 110.

Meanwhile, the camera hole CH is a region that is opened by removing the substrate 110 and the components above the substrate 110 and the camera lens LZ of the camera module CM is inserted into this opened region.

As described above, the display device 110 of the present invention has a configuration in which the camera module CM is disposed in the active area AA, and thus has advantages of omitting the spatial margin of the display device 110, which, together with the pad part, has been conventionally provided in the outer area in order to realize the camera module CM, of avoiding an increase in the width and height of the physical outer area to shield the camera module, which may be disposed in the outer area, and of avoiding a change in the design of the bezel to shield the outer area. In some cases, when a plurality of camera modules is required, a plurality of camera holes may be provided in the active area, and each camera module may be inserted into and disposed in the rear surface side of the substrate so as to be aligned with each camera hole. Alternately, a first camera module may be formed in the outer area and a second camera module may be formed by providing a camera hole in the active area AA, as illustrated.

Referring to FIG. 2, the area around the camera hole CH is defined as follows.

As shown in FIG. 2, the active area AA of the substrate 110 may include a plurality of sub-pixels, each including a light-emitting layer in a region excluding the camera hole margin CHM with a predetermined diameter including the camera hole CH. The camera hole margin CHM includes the camera hole CH, the margin area BP, which directly surrounds the sidewall of the camera hole CH, and via wiring lines 121 and 122, which bypass the camera area CH while surrounding the margin area BP. When the margin area BP is sufficiently capable of performing the functions of preventing moisture permeation and crack transfer at the side of the camera hole CH, the dummy area BPM may be almost absent. When the dummy area BPM is almost absent or "0", the via wiring lines 121 and 122 are disposed in the margin area BP or below a bank 125 positioned corresponding to the boundary of the sub-pixels in the active area AA. In this case, the via wiring lines 121 and 122 are disposed under the bank 125 and thus are not visible, or although the via wiring lines 121 and 122 are disposed below the light-emitting unit, when the organic light-emitting diode (OLED) is a top-emission type, a first electrode 123 includes a reflective electrode, thereby preventing the via wire lines 121 and 122 from being seen.

The organic light emitting layer 142 is actually provided in the active area AA inside the dummy area BPM and functions as an effective light-emission area (active area, EA).

The camera hole margin CHM including the camera hole CH, the margin area BP and the dummy area BPM, as a configuration for mounting the camera module CM on the rear surface of the substrate 110, has a configuration different from that of the sub-pixel having the organic light-emitting diode OLED in the active area AA.

The organic light-emitting layer 142 is not formed in the camera hole CH, the margin area BP surrounding the camera hole CH or the dummy area BPM, in order to enable the camera module to be introduced into the active area AA. Thus, this region does not function to emit light. The first common layer 141, the second common layer 143 and the second electrode 145, which are common in the active area AA, are provided in the dummy area BPM and thus are formed to be wider than the organic light-emitting layer 142.

In addition, the first common layer 141, the second common layer 143 and the second electrode 145 have the same edge. The reason for this is that the organic light-emitting layer 142 is formed through a deposition process including depositing a deposition material using a fine metal mask having an opening corresponding to the organic light-emitting unit for each color through the opening, whereas the first common layer 141, the second common layer 143 and the second electrode 145 are formed using a common mask through which the entire active area AA is opened, wherein, prior to formation thereof, stickers are attached to the sites corresponding to the margin area BP and the camera hole CH, so that the first and second common layers 141 and 143 and the second electrode are separated in the same line in the regions where the stickers are attached. In some cases, in a structure in which the organic stack is formed in a tandem manner, in addition to the common layers, the organic light-emitting layer and the second electrode provided therebetween may be separated in the same line as well.

Referring to FIG. 2, the "B" region in the effective emission area EA may indicate the first organic stack E1 and the second electrode 145, and the "C" region of the dummy area BPM may indicate the second organic stack E2 and the second electrode 145 disposed on the bank 125. This is distinguished in that the first organic stack E1 of the "B" region further includes the organic emission layer 142, and thus differs as to whether or not light is emitted.

The bank 125 may be formed of an inorganic insulating material such as silicon nitride film (SiNx) or silicon oxide film (SiOx), or an organic insulating material such as BCB, an acrylic resin or an imide resin. The bank 125 may be formed of an organic insulating material when formed to have a sufficient thickness as illustrated, and to shield a region other than the light-emitting unit.

Meanwhile, common layers 141 and 143, which are formed between the first electrode 123 and second electrode 145 in addition to the organic light-emitting layer 142, as the components of the organic light-emitting diode OLED provided in each sub-pixel SP in the display device 100 of the present disclosure, will be described below.

Here, the common layers 141 and 143 are so called because they are integrally formed to cover at least the entire active area AA. In general, the common layers 141 and 143 have a hole or electron transport property to assist carrier transport to the organic light-emitting layer 142 or to directly transport the carrier. When the first electrode 123 functions as an anode and the second electrode 145 functions as a cathode, the first common layer 141 under the organic light-emitting layer 142 is involved in hole injection and hole transport, and the second common layer above the organic light-emitting layer 142 is involved in electron transport and electron injection.

In the display device of the present disclosure, the common layers 141 and 143 may be each formed of an organic material. In some cases, at least one of the common layers 141 or 143 may be formed of an inorganic material or a compound of an organic material and an inorganic material. In addition, an inorganic common layer may be interposed between the common layers.

In addition, the common layer may include at least one of the first common layer 141, between the organic emission layer 142 and the first electrode 123, or the second common layer 143, between the organic emission layer 142 and the second electrode 145. In some cases, only one of the first common layer 141 and the second common layer 143 may be provided.

In addition, at least one of the first common layer 141 or the second common layer 143 may be provided as a plurality of layers.

In addition, the second electrode 145 of the organic light-emitting diode in each sub-pixel SP is integrally formed to cover the active area AA for applying a common voltage. In one embodiment, the second electrode 145 may have the widest area in the outer area (bezel) to cover all of the first and second common layers 141 and 143, as shown in FIG. 1. This aims at transferring a common voltage to the second electrode 145 through the connection of the second electrode 145 and the wiring in a part of the outer area (bezel).

In addition, when the first common layer 141 is a hole transport layer and the second common layer 143 is an electron transport layer, the second common layer 143, which has excellent interface matching with the second electrode 145 in the outer area (bezel), is formed to have a larger area than the first common layer 141, so that the first common layer 141, having a higher resistance, does not come into contact with the second electrode 145.

The sub-pixels SP are not immediately disposed at the periphery of the camera hole CH, and the periphery of the camera hole CH functions as a protective area that surrounds the camera hole CH from the edge of the camera hole CH to the margin area BP.

In addition, in the display device of the present disclosure, an end of the encapsulation stack 150 is formed at the periphery of the camera hole CH, that is, the edge of the margin area BP, in order to protect materials vulnerable to moisture permeation, among the components formed on the substrate 110. That is, the encapsulation stack 150 has an end at the periphery of the camera hole CH, in addition to the end of the edge of the outer area (bezel), that prevents lateral moisture permeation.

The encapsulation stack 150 may have an alternating organic-inorganic film structure in which a first inorganic film 151, an organic film 152, and a second inorganic film 153 are stacked. In some cases, as shown in FIG. 2, a third inorganic film 155 may be further provided on the second inorganic film 153. The component exposed to the top of the encapsulation stack 150 is an inorganic film having excellent moisture permeation, and the organic film 152 disposed between the inorganic films serves to reduce the flow of particles generated during processing and to cover the same.

The organic film 152 may act as a passage for moisture permeation when exposed to the exterior air from the top or the side, and is thus spaced apart from the camera hole CH in the outer area (bezel) and the margin area BP, respectively. Since the organic film 152 is not formed to the end of the outer area (bezel) or the side of the camera hole CH, a dam pattern DAM may be provided on the substrate 110.

The formation of the organic film 152 of the encapsulation stack 150 may be carried out by a liquid phase process, and the dam pattern DAM thereof may define a region, in which the organic film 152 is formed, by preventing the liquid overflow of a material for forming the organic film. In order to impart the function of reducing overflowing to the dam pattern, a plurality of dam patterns DAM may be spaced apart from one another by a predetermined distance, and the function of preventing primary overflow may be enhanced by increasing the width of the site closest to the organic film 152.

Meanwhile, the organic film 152 in the encapsulation stack 150 is formed to a sufficient thickness, about 5 to 20 μm, to include particles during the process by applying a liquid material to the substrate and curing the material at a low temperature of about 100° C. or less to remove the volatile material and leave the solid. On the other hand, the first and second common layers 141 and 143 and the organic light-emitting layer 142 of the organic stacks E1 and E2 are deposited in a vapor phase by evaporation. Specifically, the deposition is carried out in such a manner that the evaporated material is immediately cooled and solidified. In this case, the total thickness of the organic stacks E1 and E2 is 1,000 to 3,000 μm. The organic stacks E1 and E2 are much thinner than the organic film 152, and the internal density thereof is also very low, and thus they are vulnerable to moisture. Accordingly, in the display device of the present disclosure, the regions of organic stacks E1 and E2 are distinguished using stickers and the organic stacks E1 and E2 are spaced apart from the camera hole CH via the margin area BP so that the organic stacks E1 and E2 may remain in the margin area BP to prevent deterioration of reliability.

Although not shown, the features in which the organic film 152 of the encapsulation stack 150 is formed inside the inorganic films disposed in upper and lower parts thereof and in which the dam pattern DAM is formed so as to reduce the organic film 152 from overflowing are applied to the outer area (bezel) as well.

Meanwhile, the dam pattern DAM may be provided in a stacked structure by patterning the dam pattern DAM together with a passivation (protective) film 120 and the bank 125 in the same process.

Although not specifically illustrated, the first electrode 123 of the organic light-emitting diode OLED is connected to a thin film transistor (not shown) formed in a thin film transistor array 115, so that each driving is controlled.

A buffer layer may be further provided before the thin film transistor array 115 is formed on the substrate 110. The buffer layer is a functional layer for protecting the thin film transistor (TFT) from impurities such as alkali ions flowing out from the substrate 110 or lower layers. The buffer layer may be formed of silicon oxide (SiOx), silicon nitride (SiNx), or multiple layers thereof.

The thin film transistor provided in each sub-pixel in the thin film transistor array 115 may include a semiconductor layer, a gate electrode partially overlapping the semiconductor layer via a gate-insulating film interposed between the semiconductor layer and the gate electrode to define a channel region of the semiconductor layer, and a source electrode and a drain electrode connected to both sides of the semiconductor layer.

The illustrated thin film transistor array 115 may include a plurality of inorganic buffer layers, a thin film transistor, and at least one interlayer insulating film. Here, the interlayer insulating film is an inorganic insulating film. The inorganic buffer layer and the interlayer insulating film include inorganic insulating materials such as silicon oxide (SiOx), silicon nitride (SiNx), or silicon oxynitride layer (SiOxNy).

In addition, an uneven portion 113 is defined by removing the thickness of at least one layer of the inorganic buffer layer or the at least one interlayer insulating film in the thin film transistor array 115, and may be formed long in one direction. When a brittle substrate 110 is flexibly bent, the uneven portion 113 functions to disperse the stress transmitted horizontally from the edges of the inorganic buffer layer and the interlayer insulating film formed of an inorganic film component located thereon and to disperse the bending force applied to the flexible substrate 110 so as to reduce the bending force from being concentrated in a specific site during processing. For these functions, the uneven portion 113 is formed adjacent to the camera hole CH at least in the active area AA. The uneven portion 113 may be provided adjacent to the edge of the substrate 110 in the outer area (bezel).

Meanwhile, although the side wall of the uneven portion 113 is shown perpendicular to the bottom surface in FIG. 2, the present disclosure is not limited thereto, and the side wall may be aligned at an acute or perpendicular angle relative to the bottom surface. In this case, when forming the organic light-emitting diode (OLED), the side wall of the uneven portion 113 forms an acute or perpendicular angle with the bottom surface of the uneven portion 113 in order to separate the common layers from one another, rather than being connected (continuous) at the boundary of the uneven portion 113.

The uneven portion 113 may be formed in a plurality of horizontal patterns. The planar shape of each pattern of the uneven portion 113 may be a stripe shape extending long in one direction, or may be a zigzag pattern shape having repeated diagonal arrangements of different angles. However, the structure and shape of the uneven portion 113 are not limited thereto, and the uneven portion 113 may have various other shapes and structures as long as it may have the above mentions functions.

Meanwhile, the inorganic layers used for the inorganic buffer layer, the interlayer insulating film and the gate-insulating film may include not only silicon insulating films such as silicon oxide films, silicon nitride films and silicon oxynitride films, but also metal oxide films such as aluminum oxide films and titanium oxide films. However, in the case where the inorganic layers provided in the inorganic buffer layer include metal oxide films, the metal oxide films may be disposed apart from the thin film transistor (semiconductor layer, gate electrode, source electrode) by a distance corresponding to at least one layer, in order to reduce an electrical effect on the thin film transistor disposed thereon.

The substrate 110 may be formed of a hard material such as a plastic film, or a soft material such as a glass substrate, but the display device of the present invention is preferably formed of a flexible plastic material in order to reduce the horizontal transmission of an impact in a removal process when forming a camera hole CH.

In addition, when the substrate 110 is formed of a plastic film, an inorganic buffer layer including a plurality of inorganic layers may be included in the substrate 110 such that the inorganic buffer layer directly contacts the substrate 110 to protect the surface of the substrate 110 and realize uniform film formation on the substrate 110. In addition, a semiconductor layer buffer layer may be further included to protect the semiconductor layer of the thin film transistor formed on the inorganic buffer layer.

The via wiring lines 121 and 122 may be, for example, data lines and a plurality of power lines.

The first electrode 123 is provided on the protective (passivation) film 120 corresponding to each subpixel.

Meanwhile, the encapsulation stack 150 may include additional elements at the top thereof to provide a touch-sensing function, a user authentication function (for example, fingerprint recognition), a multi-level pressure-sensing function, a tactile feedback function, and the like. In addition, the display device may further include a polarizing plate to control display characteristics (such as external light reflection, color accuracy and luminance).

In this case, attachment may be carried out by further adding an adhesive layer to each of the additional functional elements and the polarizing plate. When the additional functional elements are included using the adhesive layer, an air gap may be present between the adhesive layer and the camera lens LZ, which is inserted from the rear surface of the substrate 110.

Hereinafter, the method of manufacturing the display device according to the present invention will be described in detail with reference to drawings.

FIGS. 3A to 3G are cross-sectional views illustrating a method of manufacturing a display device of the present disclosure.

Figure 3A:
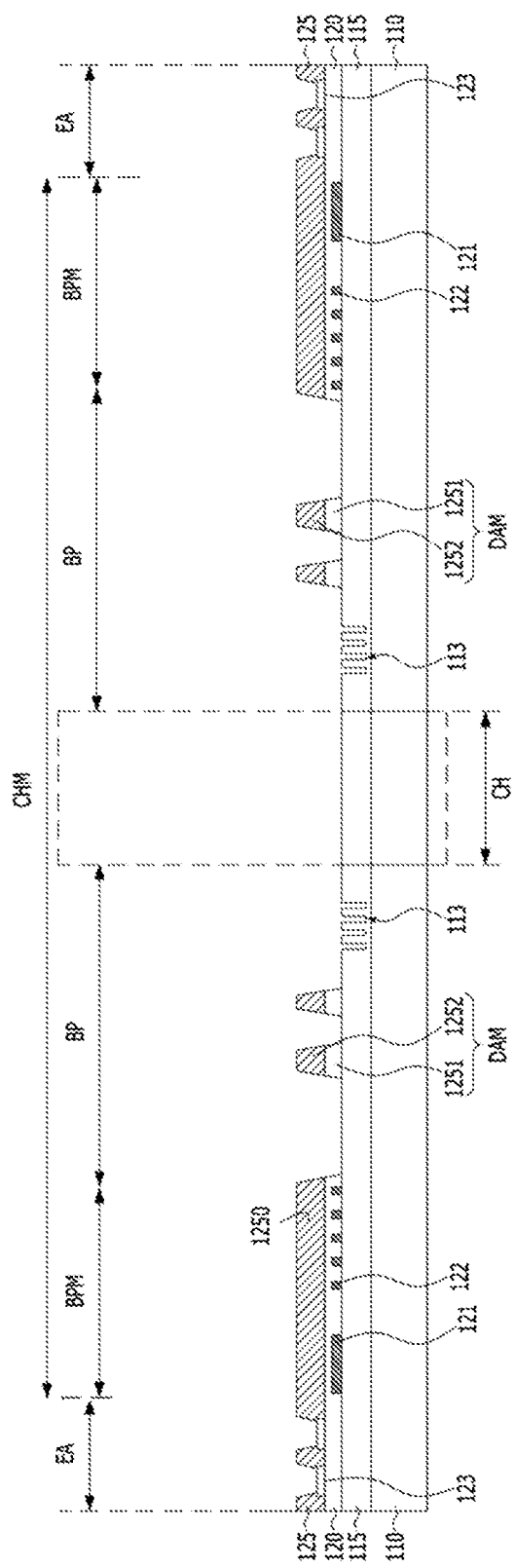
FIGS. 3A to 3G are cross-sectional views illustrating a method of manufacturing a display device according to one embodiment of the present disclosure.

As shown in FIG. 3A, a thin film transistor array 115 including a plurality of inorganic buffer layers, a thin film transistor and an interlayer insulating film is formed on a substrate 110. When the thin film transistor array 115 is formed, via wiring lines 121 and 122 may be further formed to bypass the region where the camera hole CH is formed in the same process as the source/drain electrodes of the thin film transistor. In addition, at least one layer of the inorganic buffer layer and the interlayer insulating film is etched to form a plurality of uneven portions (recess-protrusion portions, 113) in the margin area BP around the camera hole. The uneven portions 113 may be omitted in some cases, and as shown in the drawing, the layer is removed to a predetermined depth from the surface thereof by etching to form a recess therein. In some cases, a structure may be further formed on the surface of the inorganic layer to form a protrusion.

Subsequently, after a protective (passivation) film is formed on the thin film transistor array 115 including the via wiring lines 121 and 122, the protective film is selectively removed to form a contact hole (not shown) exposing one electrode of the thin film transistor in the thin film transistor array 115, and is selectively left in the margin area BP to form a first dam portion 1251.

Subsequently, a first electrode 123 connected to one electrode of the thin film transistor is formed through the contact hole (not shown). The first electrode 123 may be electrically connected to one electrode of a driving thin film transistor through the contact hole. When the organic light-emitting diode OLED of the display device is a top-emission type, the first electrode 123 may include an opaque conductive material having high reflectivity. For example, the first electrode 123 may be formed of silver (Ag), aluminum (Al), gold (Au), molybdenum (Mo), tungsten (W), chromium (Cr), or an alloy thereof.

A bank 125 defining a light-emitting part at each boundary of the subpixels SP on the first electrode 123 and a bank pattern 1250 having a width extended to a part of the dummy area BPM and the margin area BP are formed. In addition, when the bank 125 and the bank pattern 1250 are formed, a material for forming the bank is left on the first dam portion 1251 to form a second dam portion 1252. Then, the stacked first dam portion 1251 and second dam portion 1252 function as a dam pattern DAM.

The dam pattern DAM may be provided not only in the margin area BP in the illustrated active area AA, but also in the outer area (bezel) while surrounding the periphery of the active area AA. The dam pattern provided in the outer area (bezel) may be provided as a plurality of dam patterns, and these dam patterns may have the same width or different widths.

Here, the bank pattern 1250 partially overlaps the margin area BP in the periphery of the region of the active area AA in which the camera hole CH is formed.

Subsequently, an upper part of the substrate 110 including the bank 125, the bank pattern 1250, and the dam pattern DAM is cleaned.

Figure 3B:
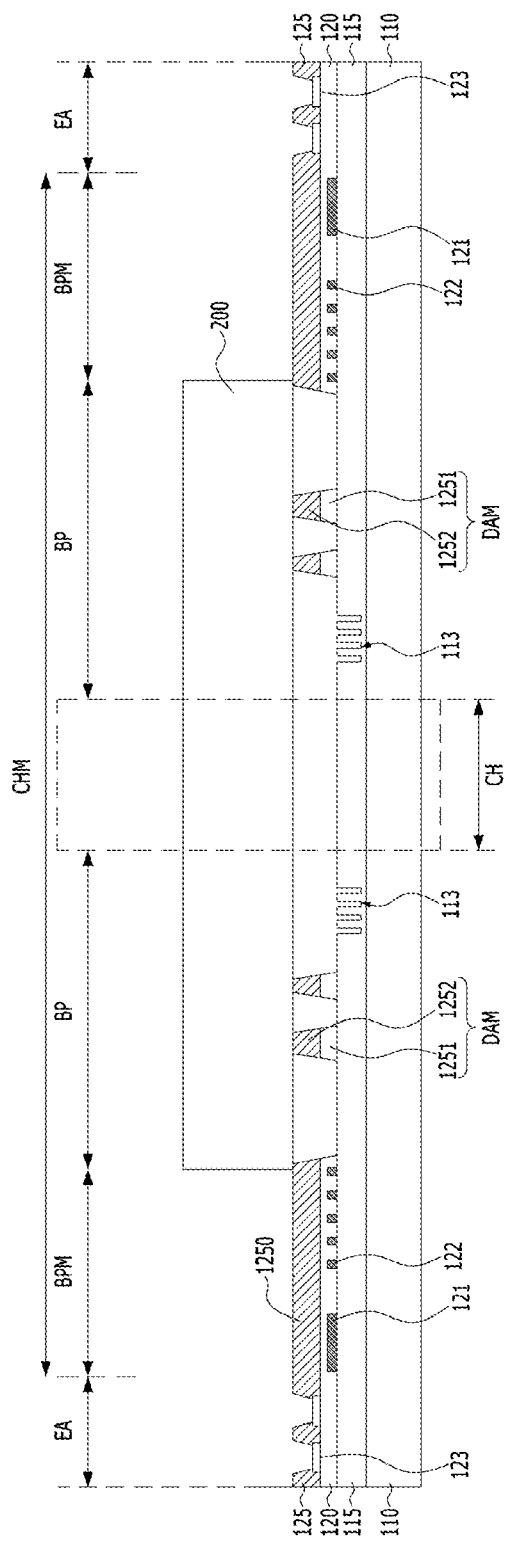

Subsequently, as shown in FIG. 3B, a sticker 200 is attached to an upper part of the bank pattern 1250 and the dam pattern DAM in a region corresponding to the margin area BP and the camera hole CH. Here, the bank pattern 1250 is disposed in a region overlapping the margin area BP. When the width of the margin area BP approximately corresponds to the diameter R of the camera hole CH, the diameter of the sticker corresponds to 3R. However, this is only an example, and the diameter of the sticker is variable. One important feature of the present disclosure is that the sticker 200 is formed larger than the camera hole CH and thus an edge of the organic stack is provided in a region spaced apart from the camera hole.

The sticker 200 is a type of film, which is thicker than the bank 125 and the bank pattern 250, protrudes from the bank pattern 1250 and the dam pattern DAM, and projects in the vertical direction after being attached.

The region in which the camera hole CH is formed and the margin area BP may have different diameters, and the shapes thereof are determined depending on the shape of the camera module (see CM in FIG. 2). For example, when the camera module CM has a two-dimensional circular shape, the region in which the camera hole CH is formed and the margin area BP have two-dimensional circular shapes, and when the camera module CM has a two-dimensional polygonal shape, the region in which the camera hole CH is formed and the margin area BP have polygonal shapes having different sizes.

The sticker 200 contacts a part of the bank pattern 1250 and the second dam portion 1252, which are the uppermost components formed in the step of FIG. 3A, and is flat so as to correspond to the substrate 110. In this case, the sticker 200 is attached to the upper part of the bank pattern 1250 overlapping the margin area BP and the dam pattern DAM provided in the margin area BP spaced apart from the bank pattern 1250. In this case, the sticker 200 is spaced apart from the upper surface of the thin film transistor array 115 in the remaining camera hole CH and the remaining margin area BP, excluding the bank pattern 125 and the second dam portion 1252 that the sticker 200 directly contacts.

Figure 3C:
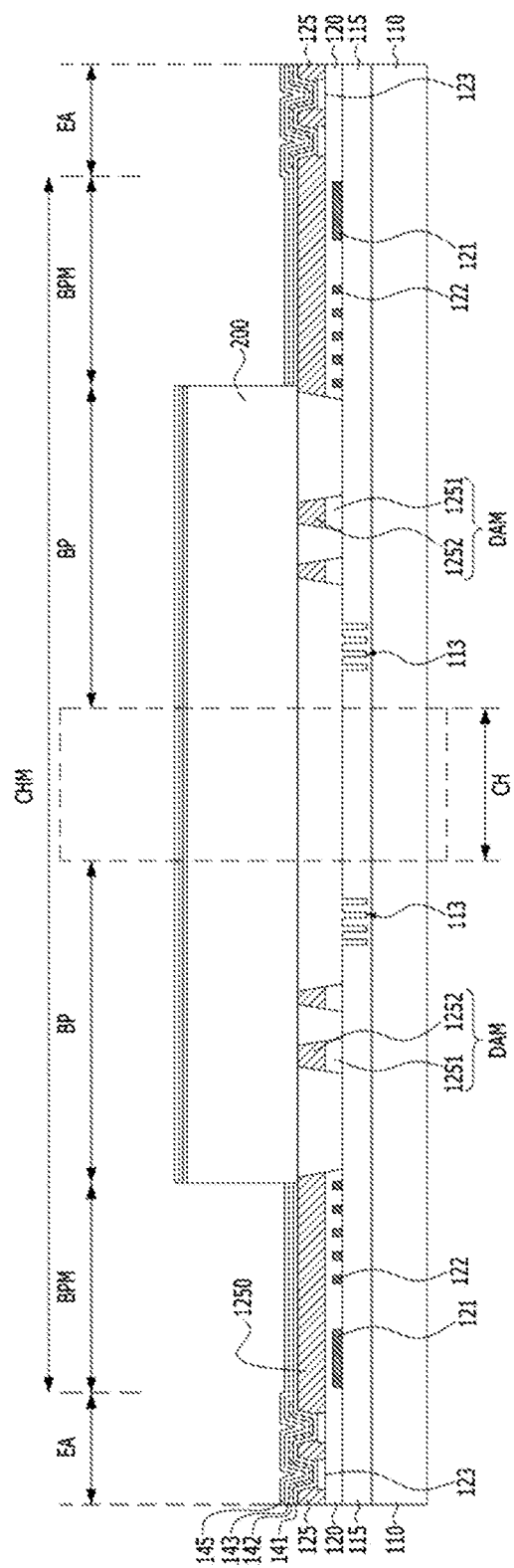

Subsequently, as shown in FIG. 3C, a first common material is deposited in a vapor phase using a common mask (not shown), through which at least the active area AA of FIG. 1 is opened, while the sticker 200 contacts a portion of the dam pattern DAM and the bank 125 on the substrate 110, to form a first common layer 141. In this case, the first common material is formed on the sticker 200, but is distinguished from the first common layer 141 deposited on the substrate 110 due to the step on the substrate 110 formed due to the thickness of the sticker 200.

Subsequently, an organic light-emitting layer 142 is formed through a fine metal mask (not shown) having an opening corresponding to each light-emitting part. In this case, the opening of the fine metal mask selectively corresponds to a region excluding the camera hole margin CHM. The opening is spaced apart from the margin area BP, thereby forming the organic light-emitting layer 142 and the first common layer in different regions.

Subsequently, a second common material is deposited in a vapor phase on the substrate 110 using a common mask (not shown), through which the active area AA of FIG. 1 is opened, to form a second common layer 143.

The structures including the first common layer 141, the organic light-emitting layer 142 and the second common layer 143 are referred to "organic stacks E1 and E2." Each layer may be a single layer or a plurality of layers. In addition, each layer may be formed of a single material, or may include, as main ingredients, a host and a dopant present in an amount of 0.1 wt % to 15 wt % with respect to the host. In some cases, two or more hosts may be provided.

The first common layer 141 disposed below the organic light-emitting layer 142 is involved in hole injection and hole transport and may be provided as an independent layer for each function. The second common layer 143 disposed above the organic light-emitting layer 142 may be involved in electron transport and electron injection, and may be provided as an independent layer for each function. The first common layer 141 transports holes to the organic light-emitting layer 142, the second common layer 143 transports electrons to the organic light-emitting layer 142, and the organic light-emitting layer 142 recombines the transported holes and electrons to form excitons. The excitons fall to a ground state, resulting in light emission.

Subsequently, a second electrode 145 is formed on the second common layer 143. When the organic light-emitting diode OLED is a top-emission type, the second electrode 145 is formed to a small thickness using a transparent conductive material such as indium tin oxide (ITO) or indium zinc oxide (IZO), or a semi-permeable metal such as AgMg, thus discharging light generated in the organic light-emitting layer 142 to an upper part of the second electrode 145.

The formation of the organic stacks E1 and E2 including the first common layer 141, the organic light-emitting layer 142 and the second common layer 143, and of the second electrode 145 may be carried out when the sticker 200 is attached, as shown in FIG. 3C. For this reason, the deposition material is formed on the sticker 200 in the region where the sticker 200 is disposed.

Figure 3D:
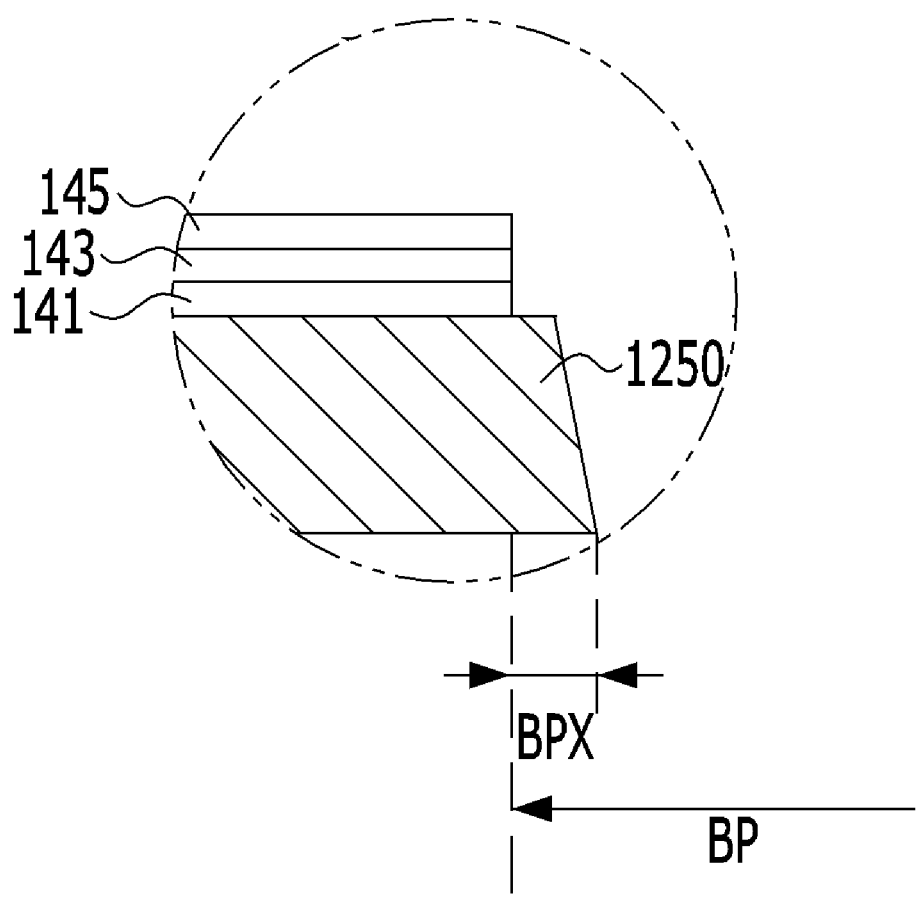

Accordingly, when the sticker 200 is removed, the deposition material present on the sticker 200 is removed along with the sticker 200, as shown in FIG. 3D, so that the first common layer 141, the second common layer 143 and the second electrode 145 remain on the substrate 110 such that they are disposed at the periphery of the margin area BP, that is, are spaced apart from the camera hole CH by the margin area BP.

Subsequently, after the sticker 200 is removed, a cleaning process is performed to remove foreign matter, such as an adhesive material from the sticker 200. In this case, the structure remaining on the bank pattern 1250 after the sticker 200 is removed will be described with reference to FIG. 3D. The sticker 200 is removed after the deposition is performed while the first common layer 141 and the second common layer 143 completely contact a vertical taper of the sticker 200. The first common layer 141 and the second common layer 143 may have completely the same vertical cross-sectional surface. Similarly, the second electrode 144 on the upper part of the second common layer 143 may also have the same vertical cross-sectional surface. In this case, a stack separator BPX, in which the organic material on the bank pattern 1250 is completely removed, may be defined. In addition, the bank pattern 1250 includes both a portion having the organic stacks 141 and 143 thereon, and a portion not having the organic stacks 141 and 143 thereon, and the boundary thereof follows the edge line of the previously removed sticker 200.

During the formation of the first common layer 141, the second common layer 143 and the second electrode 145 of FIG. 3D, the width thereof in the outer area (bezel) may be set such that an upper layer has a wider width than a lower layer so as to cover the lower layer. That is, the second common layer 143 may be formed larger than the first common layer 141, and the second electrode 145 may be formed larger than the second common layer 143. As a result, it is possible to prevent the second electrode 145 from contacting the first common layer 141, which has a high resistance and a great hole transport property, in the outer area (the bezel) and thereby to prevent the second electrode 145 from increasing contact resistance.

Figure 3E:
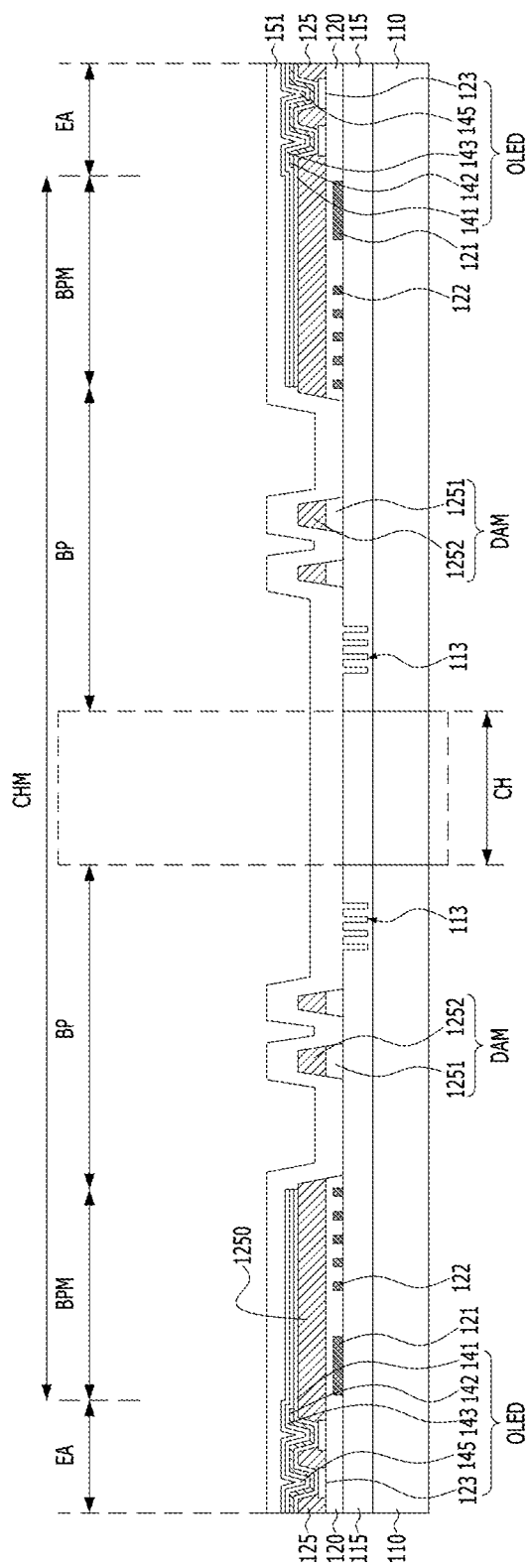

Subsequently, excluding the pad region of FIG. 1, that is, the region where the data driving driver 1500 and the touch dummy pad 160 are disposed, a first inorganic film 151 of the encapsulation stack is formed, as shown in FIG. 3E. The first inorganic film 151 also fills the camera hole margin CHM. Therefore, in the margin area BP, the first inorganic film 151 may contact the second dam portion 1252 of the dam pattern DAM and the uneven portion 113.

Figure 3F:
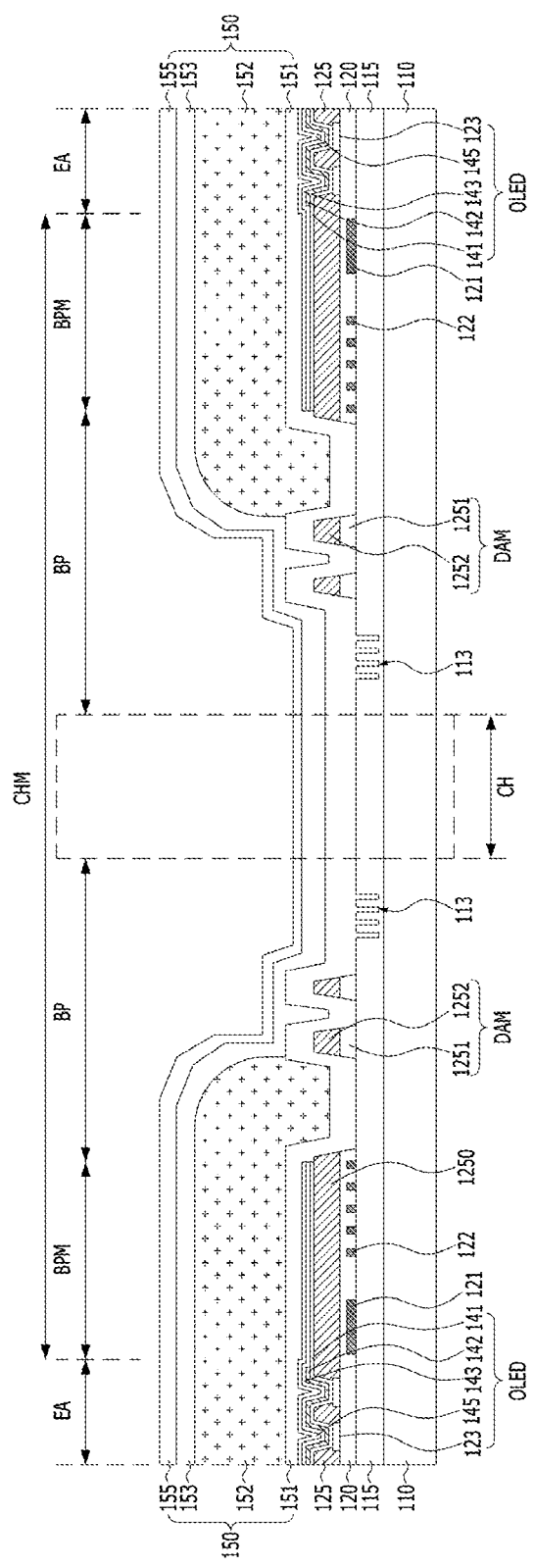

As shown in FIG. 3F, a liquid organic material is coated on the first inorganic layer 151 and cured to form an organic film 152. In this case, the liquid organic material does not flow outside of the dam pattern DAM, so that the organic film 152 does not overlap the dam pattern DAM, or only partially overlaps the dam pattern DAM if the organic pattern 152 overlaps the same, thus maintaining a distance from the camera hole CH. The dam pattern provided in the outer area (bezel) may also function to prevent overflow of the liquid organic material. The liquid organic material may be cured through a baking process at 100° C. or less.

Subsequently, a second inorganic film 153 is formed on the organic film 152 such that the second inorganic film 153 covers the organic film 152 and directly contacts the first inorganic film 151 in a region where the organic film 152 is not formed. Therefore, the first and second inorganic layers 151 and 153 contact each other in the region of the margin area BP, where the organic film 152 is not formed. In some cases, a third inorganic film 154 having a refractive index different from that of the second inorganic film 153 may be further formed to increase a light extraction effect. The third inorganic film 154 may have the same shape as the second inorganic film 153. As such, the stacked first inorganic film 151, organic film 152, second inorganic film 153 and third inorganic film 154 constitute an encapsulation stack 150. In some cases, at least one pair of an alternating structure of an organic film and an inorganic film may be further included in the encapsulation stack 150.

Figure 3G:
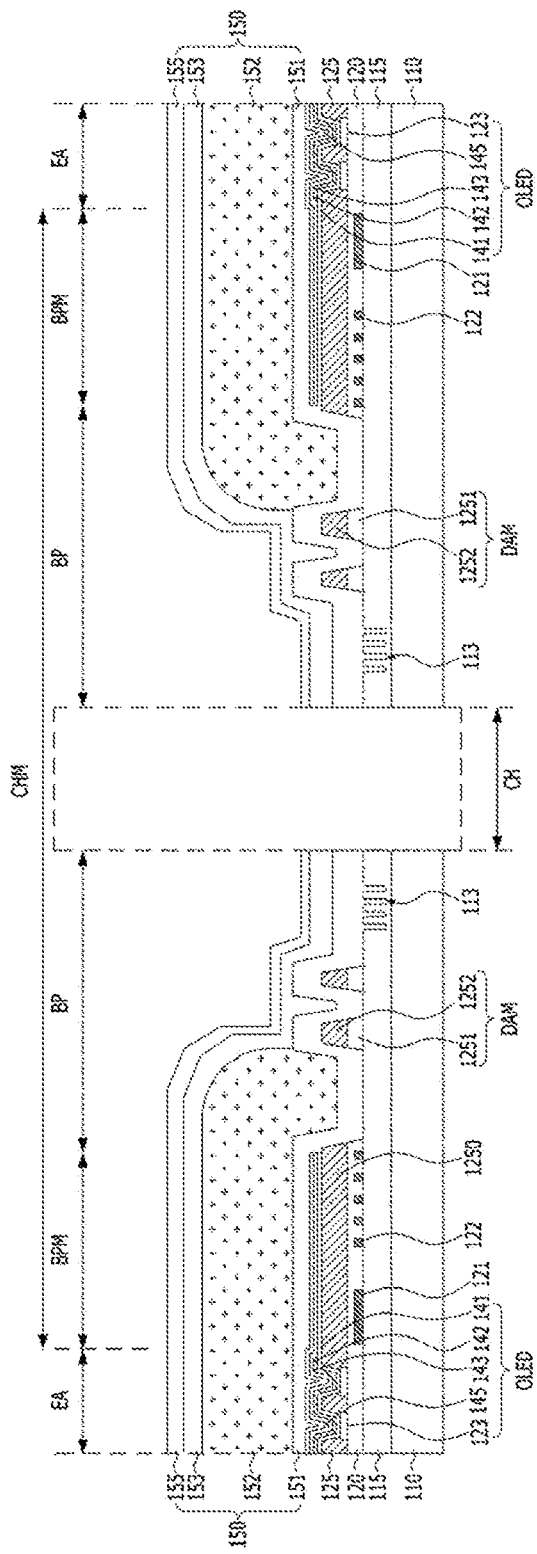

Subsequently, as shown in FIG. 3G, a laser beam is radiated to the rear surface of the substrate 110 along the laser trimming line TL (as shown in FIG. 1) to form a camera hole CH. As a result, a camera hole CH having a predetermined diameter is formed. The substrate 110 is cut when receiving a predetermined energy through laser irradiation, and the upper structure thereof is removed along therewith.

Next, a method of attaching a sticker will be described.

Figure 4:
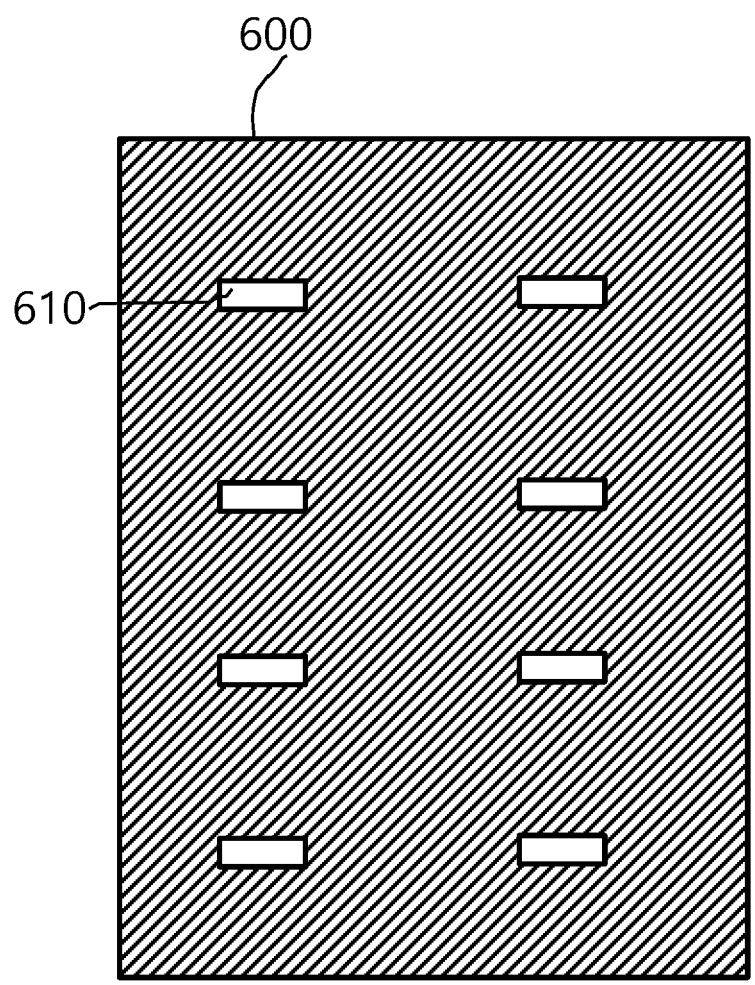
FIG. 4 is a plan view illustrating a sticker mother film according to one embodiment of the present disclosure.

FIG. 4 is a plan view illustrating a sticker mother film and FIGS. 5A to 5G are sectional views illustrating a method of manufacturing a display device according to a first embodiment of the present invention.

As shown in FIG. 4, the sticker mother film 600 includes a plurality of sticker-forming parts 610 spaced apart from each other.

In the manufacture of the display device described above, a plurality of cells corresponding to each display device is formed on a mother substrate. The sticker mother film 600 has a size equivalent to the mother substrate, and the sticker-forming part 610 of the sticker mother film 600 has a size equivalent to the camera hole CH in each cell and the margin area BP around the same.

Figure 5A:
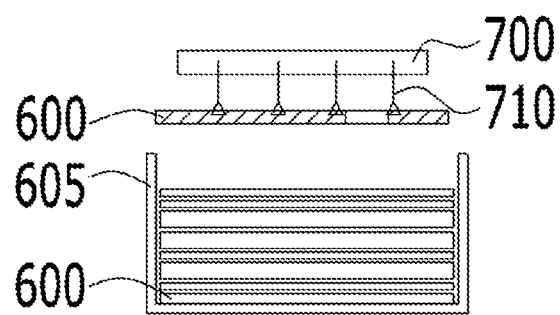
FIGS. 5A to 5G are sectional views illustrating a method of manufacturing a display device according to a first embodiment of the present disclosure.

First, as shown in FIG. 5A, the sticker mother film 600 stacked in a cassette 605 is lifted up through an ejector pin 710 of a supply machine 700 and is then transferred through the supply machine 700.

Figure 5B:
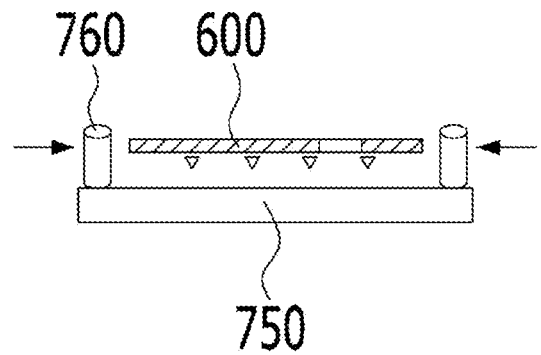

As shown in FIG. 5B, the sticker mother film 600 is aligned with a temporary fixing stage 750 from the supply machine 700 and is then centered using a position adjuster 760.

Although the sticker-forming part 610 is shown as a single component in the sticker mother film 600 in the drawing, when the sticker mother film 600 corresponds to a plurality of cells, the sticker-forming part 610 may be provided in each of the plurality of cells.

Figure 5C:
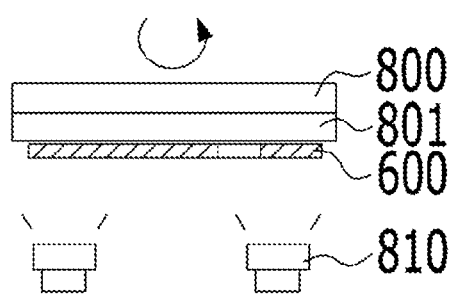

As shown in FIG. 5C, the sticker mother film 600, the center of which is adjusted between the position adjuster 760 is fixed through an adsorption plate 801 on a loading machine 800 and then the position thereof is aligned using a camera inspector 810.

Figure 5D:
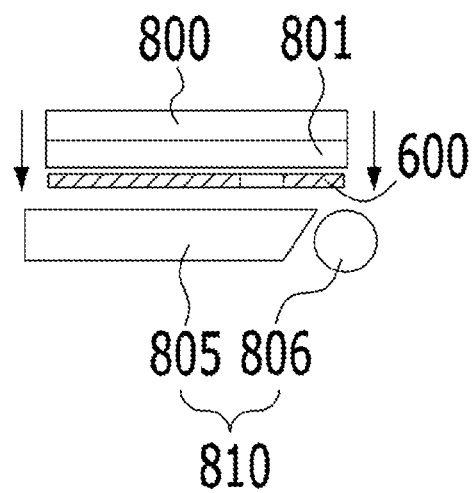
Figure 5E:
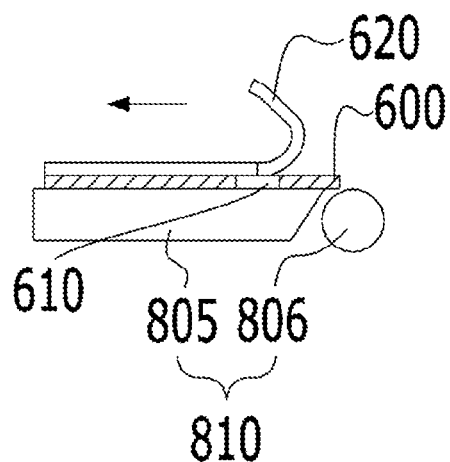

Subsequently, as shown in FIG. 5D, the sticker mother film 600 fixed through the adsorption plate 801 on the loading machine 800 is fixed on an attaching device 810 including a roller 806 and a lower attachment stage 805. Then, as shown in FIG. 5E, a protective film 620 on the sticker mother film 600 that does not contact the lower attachment stage 805 is removed to expose an adhesive surface of the sticker mother film 600.

Figure 5F:
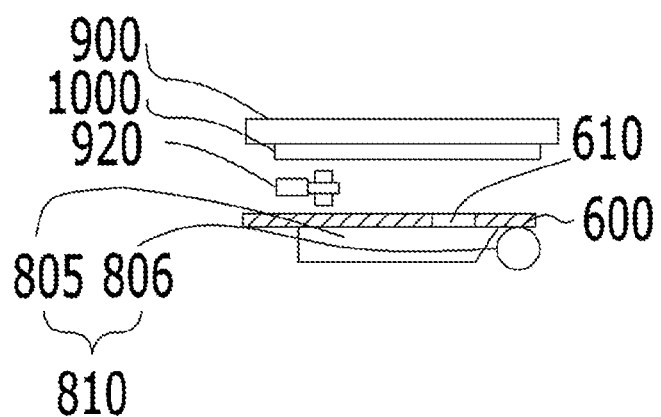

As shown in FIG. 5F, the mother substrate 1000, which is defined in the plurality of cell regions and is provided with the thin film transistor array 115, the first electrode 123 and the bank 125 in each cell region, as shown in FIG. 3A, is adsorbed on the upper attachment stage 900, and is then aligned using an alignment device 920 such that the surface, where the thin film transistor array 115, the first electrode 123 and the bank 125 are formed, corresponds to the adhesive surface of the sticker mother film 600. The mother substrate 1000 is defined as the substrate 100 of FIG. 2 in each cell, after scribing.

Figure 5G:
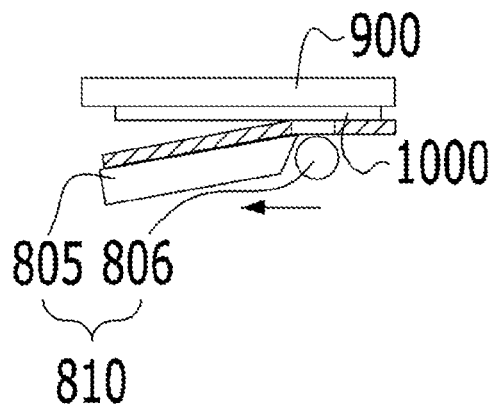

Subsequently, as shown in FIG. 5G, the sticker-forming part 610 selectively on the adhesive surface of the sticker mother film 600 may be attached to the mother substrate 1000 through the roller 806. As a result, the sticker (see 200 in FIG. 3B) is attached to the region corresponding to the camera hole and the margin area BPM in the periphery (vicinity) thereof in the active area of each cell region.

Hereinafter, a method of attaching a sticker according to another embodiment of the present invention will be described.

Figure 6A:
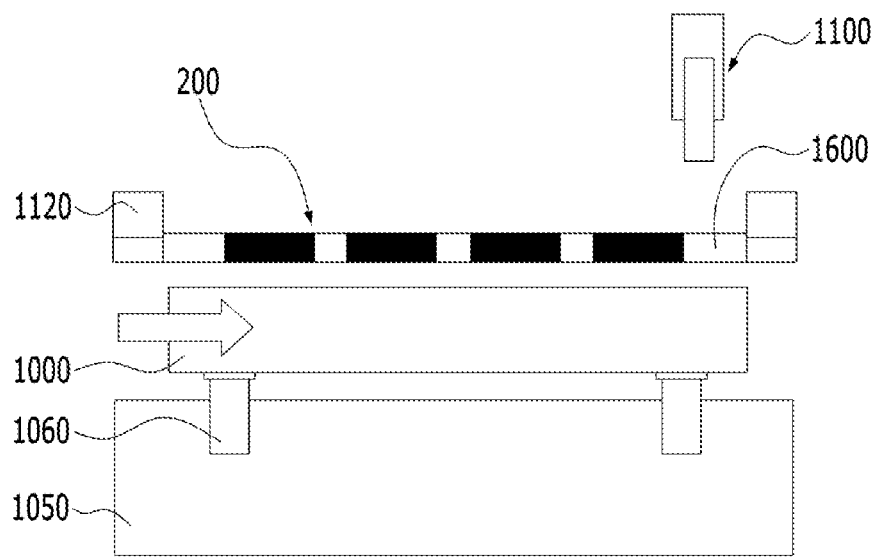
FIGS. 6A to 6C are sectional views illustrating a method of manufacturing a display device according to a second embodiment of the present disclosure.
Figure 6B:
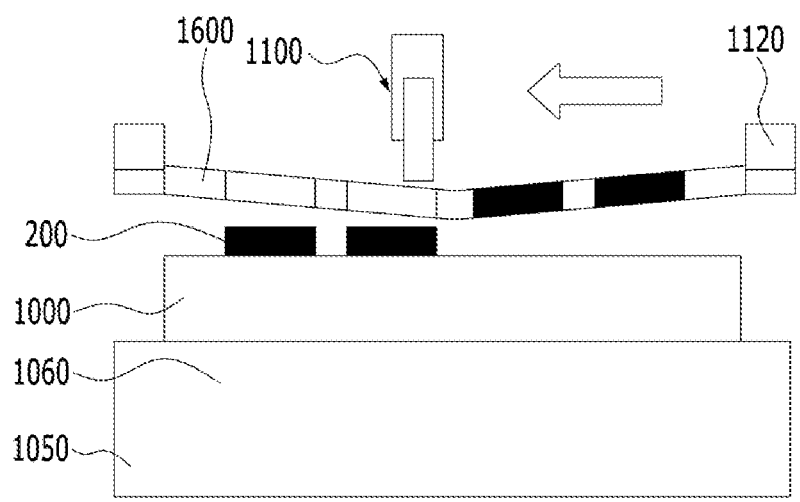
Figure 6C:
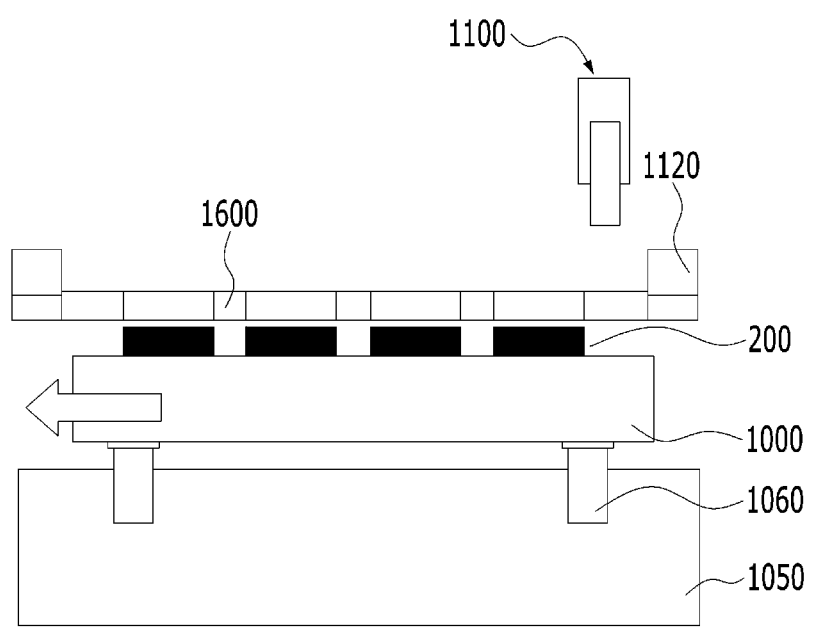

FIGS. 6A to 6C are sectional views illustrating a method of manufacturing a display device according to a second embodiment of the present disclosure.

As shown in FIG. 6A, a sticker mother film 1600 having a plurality of pre-cut sticker-forming parts 200 is prepared and fixed through a clamper 1120 and is then aligned on a mother substrate 1000. The mother substrate 1000 is then subjected to scribing and is defined as the substrate 110 of FIG. 2 in each cell. The mother substrate 1000 may be adsorbed to a vertical movement pin 1060 on a stage 1050 so that the mother substrate 1000 can perform vertical movement through the vertical movement pin 1060.

Subsequently, a squeegee 1100 is disposed corresponding to the sticker mother film 1600, and as shown in FIG. 6B, the sticker 200 is printed on and attached to the mother substrate 1000 while pressing each sticker-forming part 200 of the sticker mother film 1600.

As shown in FIG. 6C, after the sticker 200 is attached to each cell region, the mother substrate 1000 is lifted up through the vertical movement pin 1060 and then the mother substrate 1000 is separated and transferred from the stage 1050 through a transfer machine (not shown) to perform the organic stack deposition process and the second electrode formation process shown in FIGS. 3B and 3C.

As described above, after the sticker is attached to the camera hole in the substrate 110 and the margin area BP surrounding the same by the laminating method shown in FIGS. 5A to 5G or the printing method shown in FIGS. 6A to 6C, the organic stack deposition process and the second electrode formation process are performed so that the organic material and the second electrode are isolated from other regions such as the camera hole and the margin area BP due to the step provided by the sticker. Then, these components are removed along with the sticker. As a result, the plurality of common layers 141 and 143 and the second electrode 145 formed of the organic material can have the same edge around the camera hole CH and can be spaced apart from the camera hole by a margin area, so that the common layers 141 and 143 formed of an organic deposition material and the thin second electrode can be separated from the camera hole, which is exposed to outside air. In this case, the margin area can be used as an area for providing protection from the camera hole.

The display device and the method of manufacturing the same according to the present invention have the following effects:

First, in the structure in which the camera hole is provided in the active area, the sticker is attached to cover a predetermined region of the camera hole and the periphery thereof, and then the organic stack and the second electrode are formed, so that the sticker can provide natural region isolation during the deposition process, thus causing layers vulnerable to moisture and the like to be spaced apart from the camera hole without any separate mask.

Second, by using the sticker to distinguish the region where the organic stack and the second electrode are formed, it is possible to isolate the deposition material on the substrate, to which the sticker is not attached, from the deposition material, to which the sticker is attached, through the step provided by the sticker, without causing physical or chemical damage to the deposition material.

Third, the sticker is a film form, which can be easily attached and detached, although there is a structure on the substrate. Although a thin sticker is attached, the organic material can be deposited and the electrode can be formed, so that a structure with improved reliability can be realized without changing any process or equipment.

Fourth, in the structure in which the camera hole is provided in the active area, the sidewall of the camera hole is formed by a vapor deposition process so that the organic stack, which is rough and vulnerable to moisture, does not come into direct contact therewith, and the path of moisture permeation is blocked around the camera hole, so that a reliable structure can thus be realized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a substrate having an active area and an outer area surrounding the active area;
   at least one camera hole in the active area of the substrate;
   at least one light-emitting element spaced apart from the camera hole by a margin area in the active area, the at least one light-emitting element including an organic stack including at least one common layer and an organic light-emitting layer, and a first electrode and a second electrode respectively disposed below and on the organic stack;
   a bank exposing a light-emitting part of the organic light-emitting layer; and
   a bank pattern consecutively extending to the margin area from the bank in a same layer as the bank, wherein an end of the organic stack is on the bank pattern and spaced farther than an end line of the bank pattern with respect to the camera hole.

2. The display device according to claim 1, wherein the organic stack comprises the organic light-emitting layer, a first common layer disposed below the organic light-emitting layer, and a second common layer disposed on the organic light-emitting layer, wherein the first common layer, the second common layer, and the second electrode are spaced apart from the camera hole by a same distance corresponding to the margin area.

3. The display device according to claim 1, wherein the organic stack is provided in a portion of the bank pattern not overlapping the margin area and the organic stack is not provided in the margin area.

4. The display device according to claim 3, wherein ends of the organic stack and the second electrode are provided on a portion of the bank pattern not overlapping the margin area.

5. The display device according to claim 2, wherein the organic light-emitting layer is spaced farther apart from the camera hole than the first common layer.

6. The display device according to claim 1, wherein the organic stack and the second electrode are not provided in the margin area and have a same vertical tapers adjacent to the camera hole.

7. The display device according to claim 1, wherein the margin area comprises a dam pattern on the substrate.

8. The display device according to claim 1, wherein a sidewall of the camera hole is formed by the substrate and a plurality of inorganic layers on the substrate.

9. The display device according to claim 8, wherein an uneven portion is provided in at least one of the plurality of inorganic layers and substrate in the margin area such that the uneven portion is spaced apart from the camera hole.

10. The display device according to claim 1, further comprising an encapsulation stack covering the at least one light-emitting element on the substrate excluding the camera hole, and including at least one organic film and at least one inorganic film.

11. The display device according to claim 10, wherein the at least one organic film of the encapsulation stack is spaced apart from the camera hole in the margin area, and the at least one inorganic film of the encapsulation stack forms a part of a sidewall of the camera hole.

12. The display device according to claim 11, wherein the at least one inorganic film includes inorganic films on and below the organic film contacting the sidewall of the camera hole in a vertical direction.

13. The display device according to claim 2, wherein the first common layer, the second common layer and the second electrode cover a portion of the active area excluding a region including the camera hole and the margin area, and extend outwards to be provided in a portion of the outer area, and wherein the second electrode is a widest among the first common layer, the second common layer and the second electrode at the outer area.

14. The display device according to claim 1, further comprising a camera module inserted into the at least one camera hole at a rear surface of the substrate and wherein the camera module includes a camera lens introduced into the camera hole and a camera bezel supporting the camera lens.

* * * * *